(12) United States Patent
Schimmoeller et al.

(10) Patent No.: US 11,191,159 B2
(45) Date of Patent: Nov. 30, 2021

(54) PRINTED CIRCUIT BOARD CONNECTOR

(71) Applicant: Battelle Memorial Institute, Columbus, OH (US)

(72) Inventors: Andrew M. Schimmoeller, Plain City, OH (US); Jeffrey A. Friend, Grove City, OH (US)

(73) Assignee: BATTELLE MEMORIAL INSTITUTE, Columbus, OH (US)

( * ) Notice: Subject to any disclaimer, the term of this patent is extended or adjusted under 35 U.S.C. 154(b) by 0 days.

(21) Appl. No.: 17/179,885

(22) Filed: Feb. 19, 2021

(65) Prior Publication Data

US 2021/0307167 A1 Sep. 30, 2021

Related U.S. Application Data

(60) Provisional application No. 63/000,041, filed on Mar. 26, 2020.

(51) Int. Cl.
*H05K 1/11* (2006.01)
*H05K 1/14* (2006.01)
(Continued)

(52) U.S. Cl.
CPC .......... *H05K 1/117* (2013.01); *H01R 12/52* (2013.01); *H01R 12/62* (2013.01); *H05K 1/111* (2013.01); *H05K 1/118* (2013.01); *H05K 1/185* (2013.01); *H05K 2201/09036* (2013.01); *H05K 2201/09063* (2013.01); *H05K 2201/09445* (2013.01); *H05K 2201/2027* (2013.01)

(58) Field of Classification Search
CPC ........ H01R 12/52; H01R 12/62; H05K 1/117; H05K 1/111; H05K 1/118; H05K 1/185; H05K 2201/09036; H05K 2201/09063; H05K 2201/09445; H05K 2201/2027
USPC .......................................................... 361/792
See application file for complete search history.

(56) References Cited

U.S. PATENT DOCUMENTS 6,496,384 B1 * 12/2002 Morales ................ H05K 3/366
29/830
2009/0178271 A1 * 7/2009 Egitto .................... H01C 17/24
29/620

(Continued)

OTHER PUBLICATIONS

International Search Report dated May 7, 2021 from PCT/2021/018704.

*Primary Examiner* — Andargie M Aychillhum
(74) *Attorney, Agent, or Firm* — Fay Sharpe LLP

(57) ABSTRACT

A printed circuit board connector for orthogonal mating of two or more printed circuit boards. The connector utilizes interior perimeter trace connections of a main printed circuit board and internal trace connections of a mating printed circuit board in conjunction with external trace connections. The main board may utilize surface connections, where both external trace connections and internal trace connections are exposed on a surface of the main board to couple to the mating board. The main board may include a slot or pocket, allowing for the partial insertion of the mating board into the main board, with internal trace connections disposed within the slot or pocket. The slot or pocket may extend through the main board, such that the internal trace connections are disposed along a side of the pocket to couple with corresponding internal trace connections of the mating board.

20 Claims, 13 Drawing Sheets

(51) Int. Cl.
*H01R 12/52* (2011.01)
*H01R 12/62* (2011.01)
*H05K 1/18* (2006.01)

(56) References Cited

U.S. PATENT DOCUMENTS

2013/0033593 A1 12/2013 Snider et al.
2019/0037689 A1 1/2019 Du et al.
2019/0165501 A1 5/2019 Takken et al.

\* cited by examiner

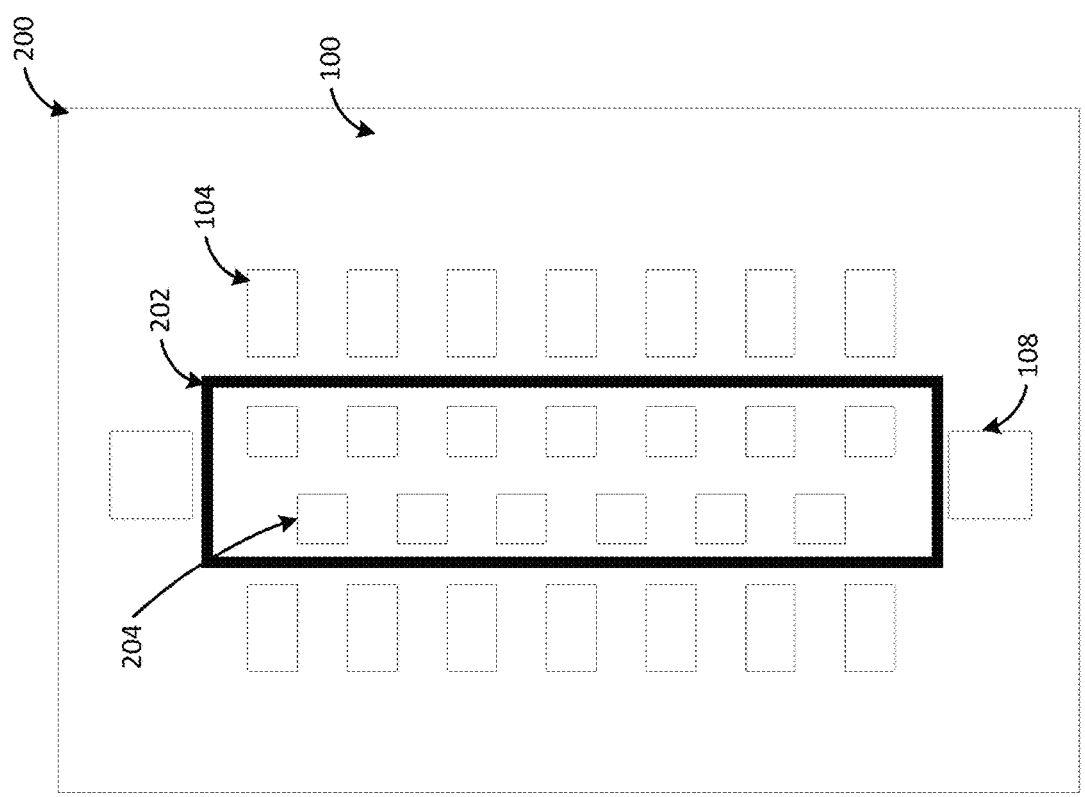

PRINTED CIRCUIT BOARD CONNECTOR

CROSS REFERENCE TO RELATED APPLICATIONS

This application claims the benefit of U.S. Provisional Patent Application Ser. No. 63/000,041 filed Mar. 26, 2020, and titled PRINTED CIRCUIT BOARD CONNECTOR, the disclosure of which is hereby incorporated by reference in its entirety into this application.

BACKGROUND

This disclosure relates in general to printed circuit boards (PCBs). In particular, this disclosure relates to improved connections between orthogonally coupled PCBs.

Orthogonal PCB-to-PCB connections are a challenge in high density and miniaturized electronics applications. Designers are typically limited to sizes and geometries of connectors that use pins and housings. These physical connectors take up valuable space and limit the electrical and mechanical opportunities for miniaturizing a product. That is, the physical connectors require space not only on the main PCB, but also on the mating PCB, which reduces the amount of space available of other components and PCB trace routing.

A further challenge in high density and miniaturized electronics applications involves the mating of PCBs to PCBs, such that when one board is to be treated as a component, the boards are typically mated by laying the component-type board on another board (stacked on top of each other). This approach generally uses a solder to make connections similar to utilizing a ball grid array. As with the challenge, this connection approach takes up valuable space that could be used for component layout.

It would however, be desirable to provide an improved mechanism for orthogonally connecting two or more PCBs that do not use pins and housings and alleviate some or all of the aforementioned issues inherent in current multi-PCB applications.

SUMMARY

Various details of the present disclosure are hereinafter summarized to provide a basic understanding. This summary is not an extensive overview of the disclosure and is neither intended to identify certain elements of the disclosure, nor to delineate the scope thereof. Rather, the primary purpose of this summary is to present some concepts of the disclosure in a simplified form prior to the more detailed description that is presented hereinafter.

In accordance with one aspect of the present disclosure, there is provided a printed circuit board edge terminal connector of a main printed circuit board. The edge terminal connector includes at least one trace coupled to at least one external pad, with the at least one external pad positioned around a perimeter configured to receive an associated mating printed circuit board. The edge terminal connector further includes at least one trace coupled to at least one perimeter interior pad, with the at least one perimeter interior pad positioned within the perimeter.

In accordance with another aspect of the present disclosure, there is provided a printed circuit board edge terminal connector of a mating printed circuit board. The edge terminal connector includes at least one external pad coupled to at least one trace. The at least one external pad is positioned on a first outer surface of the mating printed circuit board and configured to contact a corresponding at least one external pad of an associated main printed circuit board. The edge terminal connector further includes at least one internal pad coupled to at least one trace, with the at least one internal pad positioned on a second outer surface of the mating printed circuit board.

In accordance with yet another aspect of the present disclosure, there is provided a printed circuit board that includes a core comprising a plurality of layers, at least one layer including an internal conductive trace. The printed circuit board further includes a printed circuit board edge terminal connector, which includes at least one external trace coupled to a corresponding at least one external pad. The at least one external pad is positioned around a perimeter configured to receive an associated mating printed circuit board. The printed circuit board edge terminal connector further includes at least one internal trace pad coupled to the internal conductive trace, with the at least one internal pad positioned within the perimeter.

In accordance with still another aspect of the present disclosure, there is provided a printed circuit board that includes a core and a printed circuit board edge terminal connector. The core includes a plurality of layers, with at least one layer including an internal conductive trace. The printed circuit board edge terminal connector includes at least one external trace and at least one internal trace. The at least one external trace is coupled to a corresponding at least one external pad, with the at least one external trace pad positioned on a first outer surface of the mating printed circuit board and configured to contact a corresponding at least one external trace pad of an associated main printed circuit board. The at least one internal trace is coupled to a corresponding at least one internal trace pad, such that the at least one internal trace pad positioned on a second outer surface of the mating printed circuit board.

BRIEF DESCRIPTION OF THE DRAWINGS

The subject disclosure may take form in various components and arrangements of components, and in various steps and arrangement of steps. The drawings are only for purposes of illustrating the preferred embodiments and are not to be construed as limiting the subject disclosure.

FIG. 2 is a top view of a main printed circuit board (PCB) footprint for coupling with a mating PCB in accordance with one aspect of the exemplary embodiment.

DETAILED DESCRIPTION

Figure 1A:
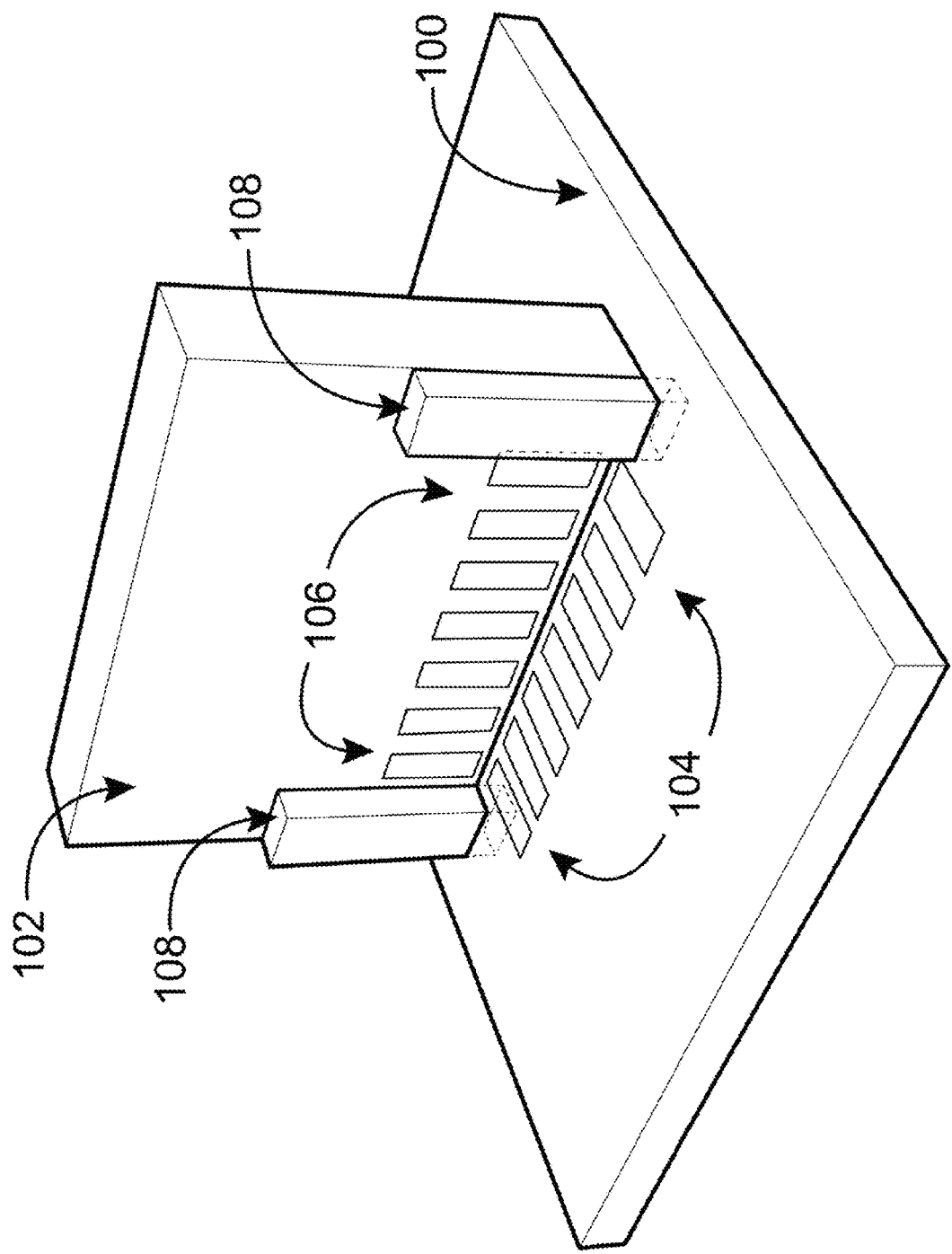
FIG. 1A is a representative illustration of a mating PCB coupled to a main PCB in accordance with one aspect of the exemplary embodiment.

The exemplary embodiments are described herein with reference to preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

One or more implementations of the subject application will now be described with reference to the attached figures, wherein like reference numerals are used to refer to like elements throughout.

As used herein, a printed circuit board (PCB) may be rigid, semi-rigid, rigid-flexible, or flexible as will be known in the art. It will be appreciated that use of the embodiments described hereinafter may be used in conventional PCBs with embedded active and/or passive components are described in the publication "IPC-7092; Design and Assembly Process Implementation for Embedded Components," dated February 2015, published by IPC (also known as Association Connecting Electronics Industries).

In embodiments disclosed herein, there are presented a circuit board fabrication and assembly methodology for constructing circuit boards with both active and passive embedded integrated circuit (IC) package components as well as more traditional circuit board processes. The connection method is fabricated by utilizing conductive trace terminals at the edge of the circuit boards on both internal and external layers of the boards. The connection may be soldered orthogonally directly to a mating circuit board using pads on the edge of the board or may serve as a receptacle to mate with a more traditional header from a mating circuit board. The number of connection points can be as few as or as many as desired and may be limited in spacing by the available manufacturing processes from trace and space in the circuit board fabrication process. Accordingly, the present embodiments allow for a higher density of connections compared to the use of traditional connectors.

It will be appreciated that while illustrated in the subject disclosure as perpendicular/orthogonal, the mating of the mating PCB to the main PCB may occur at any suitable angle allowing coupling of the two boards together. That is, the mating PCB may be positioned at any angle relative to the main PCB provided the connections are maintained. It will be appreciated that such a variation of angles enables a multitude of design considerations for cooling, enclosures, PCB shapes, and the like. Accordingly, the subject illustrations are intended to provide non-limiting examples of coupled mating and main PCBs and should not be interpreted as limiting coupling to a perpendicular/straight connection.

Figure 1B:
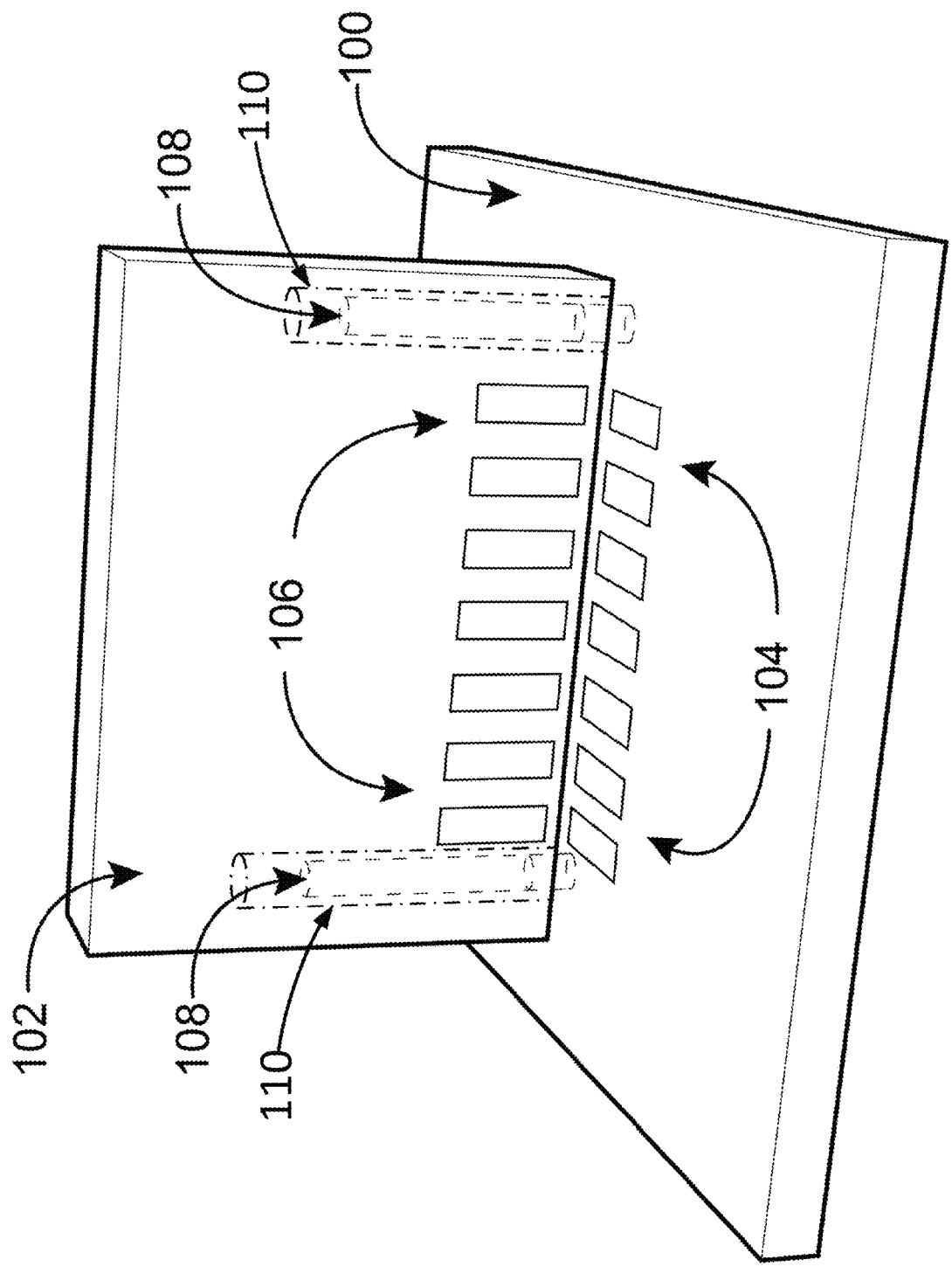
FIG. 1B is a representative illustration of a mating PCB coupled to a main PCB in accordance with another aspect of the exemplary embodiment.

Referring now to FIGS. 1A-1B, there is shown a main PCB 100 orthogonally coupled to a mating PCB 102 in accordance with one embodiment of the subject application. As shown in FIGS. 1A-1B, the main PCB 100 includes a plurality of external traces/pads 104 positioned on a top surface of the main PCB 100. Similarly, the mating PCB 102 includes a set of external traces/pads 106 along an exposed surface of the mating PCB 102. To assist in coupling the main PCB 100 with the mating PCB 102, the main PCB further includes a set of guides/mounting posts/alignment pins 108 to retain the mating PCB 102 in position. In varying embodiments contemplated and disclosed herein, the main PCB 100 and the mating PCB 102 may be implemented as embedded printed circuit boards having high or low density, as well as various combinations thereof, e.g., embedded high density main PCB and low density external component mating PCB, or vice versa.

It will be understood that the illustration in FIG. 1A only shows one side of the mated boards 100, 102, and that the opposing side of the mated boards 100, 102 may also include traces/pads 104, 106 and guides/mounting posts 108. FIG. 1B illustrates an alternate implementation of the guides/mounting posts/alignment pins 108, wherein the guides/mounting posts/alignment pins 108 are inserted into cavities 110 of the mating PCB 102. In such an embodiment, one or more cavities 110 may be included in the mating PCB 102 to receive the guides/mounting posts/alignment pins 108. Accordingly, the skilled artisan will appreciate that the illustration in FIG. 1B is exemplary and not limiting to the number of guides/mounting posts/alignment pins 108 and corresponding cavities 110. The skilled artisan will further appreciate that the guides/mounting posts/alignment pins 108 are capable of implementation in a variety of configurations, including, for example and without limitation, cylindrical, round, rectangular, trapezoidal, hexagonal, star, or myriad other shapes. Further, the length and other dimensions of the guides/mounting posts/alignment pins 108 may be determined in accordance with the width and depth of the cavity 110 or the presence of external components of the mating PCB 102, the relative sizes of the main PCB 100 and the mating PCB 102, and the like, as will be understood by those skilled in the art.

The guides/mounting posts/alignment pins 108 are illustrated in FIGS. 1A and 1B for example purposes only, and other implementations may utilize internal posts (i.e., extending into the mating PCB 102), or rely on the solder connections (discussed below) to maintain the position of the mating PCB 102 relative to the main PCB 100. It will therefore be appreciated that while shown as present, the use of guides/mounting posts/alignment pins 108 in the disclosed embodiments may be optional and dependent upon design constraints of the final implementation of the coupled boards 100 and 102. The optional guides/mounting posts/alignment pins 108 may be formed directly on the main PCB 100 or subsequently attached thereto.

The external traces/pads 104 and 106 may comprise of conductive pads formed by etching or additive process. Material could be standard copper plated with other metals (i.e. nickel, gold) for solderability and corrosion resistance. Pads could have traces connected to them for signals or could have vias integrated for internal layer connections. The guide/mounting posts/alignment pins 108 may be friction based to hold the mating PCB 102 in position. Alternatively, the guide/mounting posts may be cylindrical or rectangular extending into preformed cavities of the mating PCB 102 (not shown). In some embodiments, the guide/mounting posts/alignment pins 108 may be implemented as tabs on both the main PCB 100 and the mating PCB 102, allowing for a solder connection to provide structural support thereof. Further, the skilled artisan will appreciate that the shape, length, and composition of the guide/mounting posts/alignment pins 108 may vary in accordance with the mating PCB shape/design/thickness/rigidity, and the like. Accordingly, variations of the guide/mounting posts/alignment pins 108 are contemplated herein.

Figure 3:
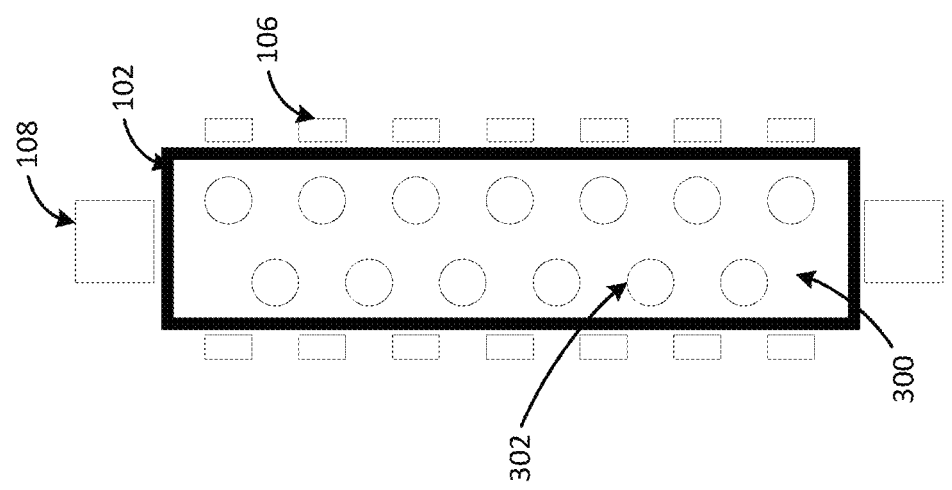
FIG. 3 is an edge view of the mating PCB for coupling to the main PCB of FIGS. 1A-1B in accordance with one aspect of the exemplary embodiment.

Turning now to FIG. 2, there is shown the footprint of the main PCB 100 for receiving the mating PCB 102 in accordance with one example embodiment of the subject application. As shown in FIG. 2, the footprint 200 depicts the outline 202 of the mating PCB 102 for purposes of illustrating the bottom surface 300 of the mating PCB 102 (as shown in FIG. 3). The footprint 200 illustrates a dual-side connection, wherein external pads 104 and 106 are utilized on both sides of the main PCB 100 and mating PCB 102. It will be understood that in some embodiments contemplated herein, a single side of external pads 104, 106 may be used, or alternatively, no external pads 104, 106 are present on the main PCB 100 and mating PCB 102.

As shown in FIG. 2, the footprint 200 illustrates the external traces/pads 104 positioned on either side of the perimeter of the mating PCB 102 outline 202. Guide/mounting/alignment posts 108 are positioned at opposite ends of the outline 202 to couple the mating PCB 102 to the main PCB 100. The footprint 200 further illustrates a plurality of perimeter interior pad connections 204 located within the perimeter of the outline 202 for connecting to corresponding pads 302 of the mating PCB 102 (as shown in FIG. 3). In accordance with one embodiment, the perimeter interior pads 204 may be connected to internal or external traces (not shown) of the main PCB 100, wherein the internal traces form connections between disparate portions/components of the PCB 100 or to other mating PCBs 102 further coupled to the main PCB 100. It will be understood that while illustrated in FIG. 2 as comprising two rows, the number of perimeter interior pads 204 may be in any number of rows and in any number of individual pads in accordance with the design of the main PCB 100 and the mating PCB 102. Accordingly, the skilled artisan will appreciate that the depiction of the perimeter interior pads 204 in FIG. 2 is representative of one example implementation, and not intended as limiting the present disclosure.

FIG. 3 illustrates a bottom view of the mating PCB 102 in accordance with one embodiment of the subject application. The bottom 300 of the mating PCB 102 shown in FIG. 3 represents one example version of a mating PCB 102 and the skilled artisan will appreciate that other configurations are contemplated in accordance with the subject disclosure. As shown in FIG. 3, the bottom 300 of the mating PCB 102 include a plurality of solder balls 302 attached to internal trace/pads/component edges (as illustrated and described with respect to FIG. 4 below) configured and arranged to mate with the perimeter interior pads 204 of the main PCB 100. It will be understood that while depicted in FIG. 3 as being in rows, the solder balls 302 may be suitably arranged in a variety of different configurations and numbers in accordance with the design considerations of the main PCB 100 and the mating PCB 102, and the present disclosure is not limited to the configuration illustrated in the example embodiment of the FIG. 3. It will further be appreciated that while depicted in FIG. 3 as being coupled to internal traces, the solder balls 302 may be positioned on the edge of the mating PCB 102 and coupled to external traces (not shown) of the mating PCB 102, similar to the main PCB 100 discussed above. The skilled artisan will appreciate that the pitch of the solder balls 302 may vary from 1.0 mm to 0.005 m, including but not limited to current manufacturing practices of 0.8 mm to 0.2 mm or variations of suitable ball grid array, as may be available. The external trace/pads 106 are visible on the outside surfaces of the mating PCB 102 illustrated in FIG. 3 and are configured and arranged to mate with the external trace/pads 104 of the main PCB 100.

Figure 4:
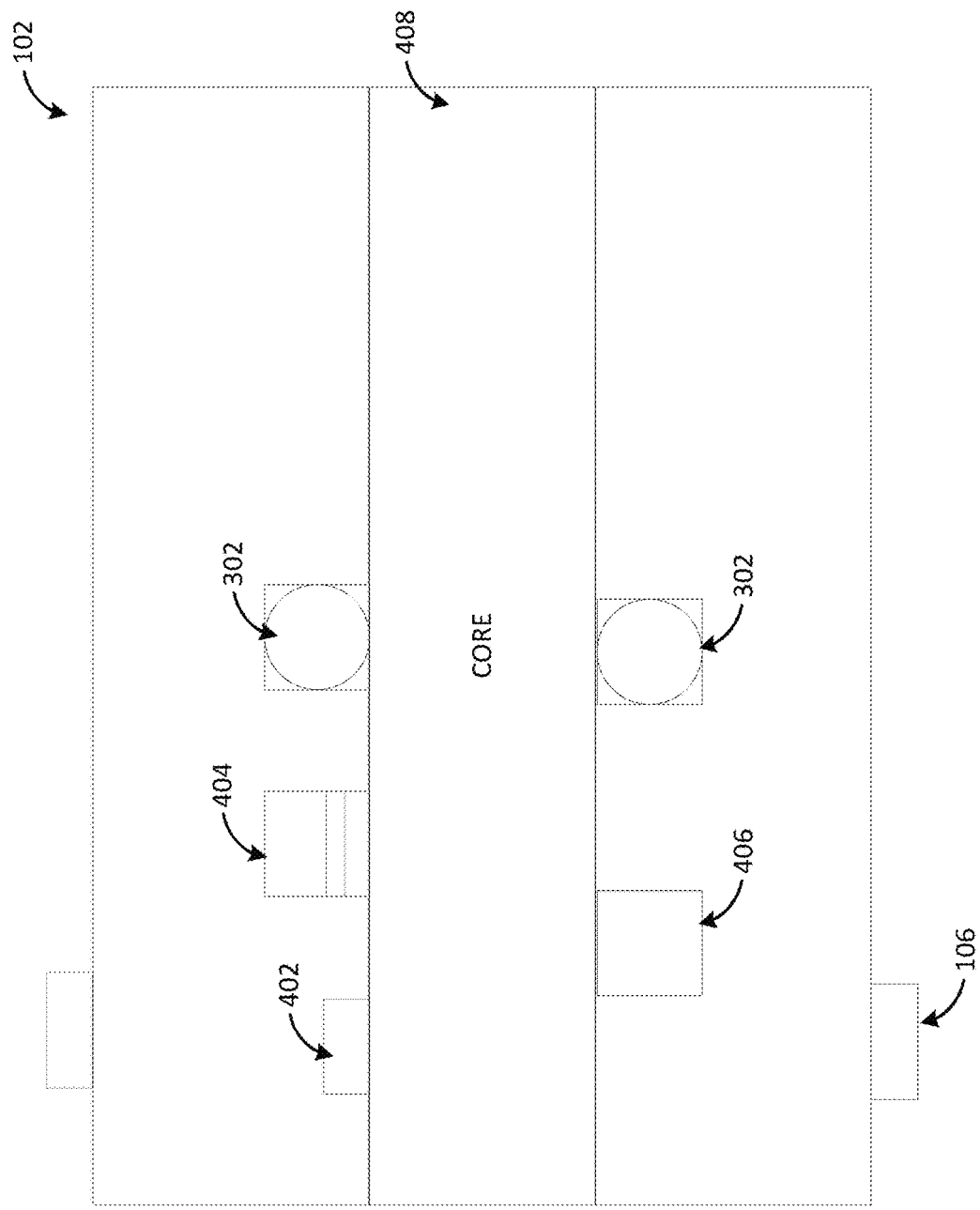
FIG. 4 is an edge surface detailed view of the mating PCB used in accordance with one aspect of the exemplary embodiment.

FIG. 4 provides a more detailed view of the surface 300 of the mating PCB 102 in accordance with one embodiment of the subject application. The illustration in FIG. 4 depicts a partial cutaway view of the edge 300 of the mating PCB 102 showing the solder balls 302 and the underlying structure thereof. As shown, each solder ball 302 is coupled to an internal layer trace 402, a rectangular conductor 404 (e.g. a trace and/or wire) embedded within the mating PCB 102. The solder ball 302 is capable of deposition on the internal layer trace 402 or the rectangular conductor 404. Further, shown is an internal component edge 406 and a solder ball 302 deposited on the internal component edge 406. Examples of the solder ball 302 and compositions thereof are illustrated and discussed in greater detail with respect to FIGS. 11-12 below. The embedded terminal conductors/contacts shown in FIG. 4, i.e., internal trace 402, rectangular conductor 404, component edge 406, etc., may be construction via various materials and methods including, for example and without limitation copper, gold, silver, and the like, as well as being built up of multiple conductive layers or exposed package components. The mating PCB 102 of FIG. 4 further illustrates a PCB substrate or core 408 and an exemplary depiction of the external trace/pad 106. It will be appreciated that the use of the PCB core 408 provides for tight tolerance control with respect to terminal (402-406) alignment relative to the main PCB 100.

Figure 5:
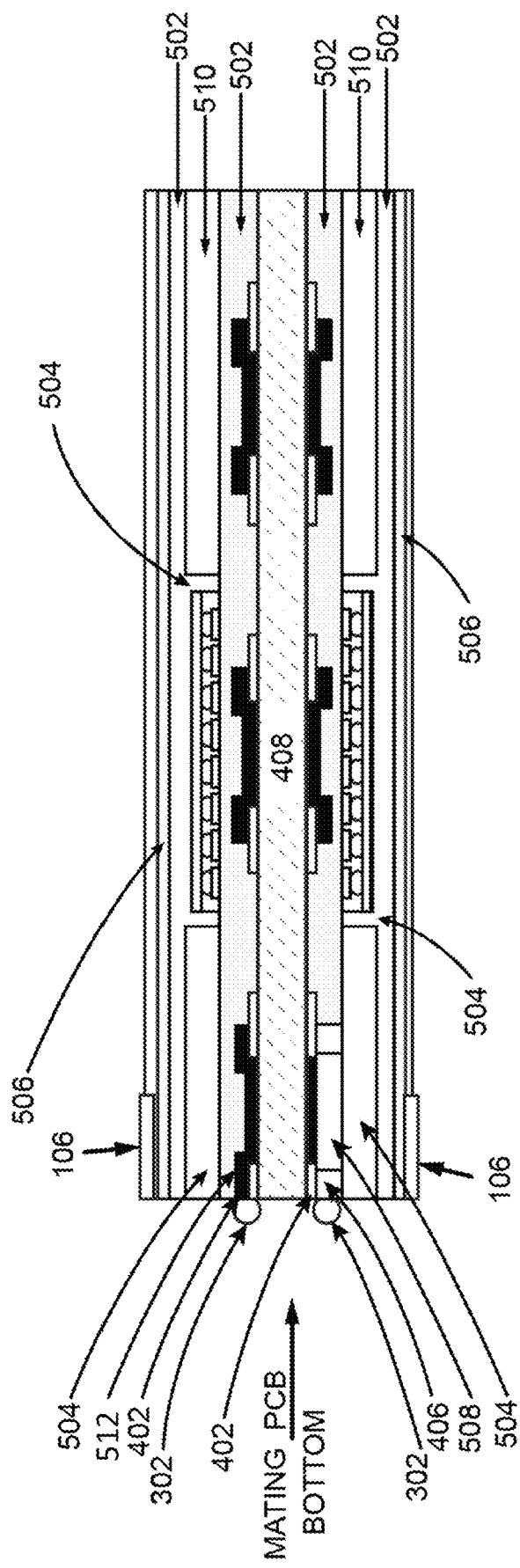
FIG. 5 is a cross-sectional view of the mating PCB for coupling to the main PCB in accordance with one aspect of the exemplary embodiment.

Referring now to FIG. 5, there is shown a cross-sectional view of the mating PCB 102 lengthwise, with the bottom of the mating PCB 102 shown to the left and the top of the mating PCB 102 shown to the right. The mating PCB 102 is depicted in FIG. 5 as comprising four layers for example purposes only, and the skilled artisan will appreciate that other embodiments contemplated herein may comprise additional layers, e.g., 6, 10, 20, etc. As shown, the mating PCB 102 incorporates the core 408 extending lengthwise through the mating PCB 102. In accordance with varying embodiments, the core 408 is a copper clad (2 side) core, e.g. a dielectric material with copper, such as copper foil, bonded to both sides. The core 408 may be any desired dielectric material (rigid, semi-rigid, rigid-flexible, flexible), such as cured fiberglass, woven material with or without epoxy resin, and the like. It will be appreciated that other materials may be used for the core 408, including, for example and without limitation advanced materials such as or derived from Rodgers, polyimide, ceramic, PTFE, or BT epoxy. The skilled artisan will appreciate that the core 408 provides a suitable substrate upon which the mating PCB 102 is built, as well as providing support and rigidity when the mating PCB 102 is rigid, or flexibility when the mating PCB 102 is implemented as a flexible or semi-rigid PCB.

The mating PCB 102 of FIG. 5 further includes a component mounting base 502, located on either side of the core 408 and configured to receive/form embedded physical components (e.g., embedded component 508). It will be appreciated that while shown on either side of the core 408, the mating PCB 102 may utilize a single component mounting base 502 positioned on one side of the core 408 of the mating PCB 102. In accordance with one embodiment, the component mounting base 502 may comprise of a dielectric layer such as prepreg, or unreinforced dielectric material such as but not limited to FR4 or epoxy glass. Embedded component 508 may correspond to any component that is positioned within one or more layers of the mating PCB 102 in contrast to being positioned on an outer surface thereof. Embedded may further include components 508 that are integrally formed within one or more of the layers or have been inserted into a cavity 504 formed within one or more layers of the mating PCB 102. In other embodiments, the component 508 may be partially embedded within the mating PCB 102, such that a portion of the component 508 is integrally formed within one or more layers of the mating PCB 102, or a portion of the component is inserted into a cavity formed in one or more of the layers of the mating PCB 102, with a portion of the component 508 extending outwardly towards an outer surface of the mating PCB 102. Alternatively, a partially embedded component 508 may not extend outward from the surface, but is exposed to the outer surface of the mating PCB 102.

Regardless of whether the component 508 is fully embedded or partially embedded, the component 508 utilizes the edge 406 for connection to the main PCB 100. Alternatively, such a component 508 will include electrical connectors (not shown), such as terminals, that are configured to be connected to one or more electrically conductive layers of the mating PCB 102.

Furthermore, and as defined in IPC-7092, an active component is an electronic component that can change a signal or respond to the signal in a way that is dependent upon the nature of the signal and/or other controlling factors. Examples of active components include diodes, transistors, amplifiers, thyristors, gates, Application-Specific Integrated Circuits, semiconductor chips, micro-controller, and other integrated circuits that are used for the rectification, amplification, and switching of analog or digital circuits. A passive component, as defined in IPC-7092, a passive component is a discrete electronic device that behaves in a fixed way in response to a signal of a given characteristic. Examples of passive components include resistors, capacitors, inductors, and transformers.

As shown in FIG. 5, the component mounting base 502 may include one or more cavities 504, embedded components 508, and formed passive components 512. In some embodiments, the cavities 504 are modified prepreg material. In such embodiments, the prepreg may function as an insulating layer and provide a bonding agent for joining layers of the PCB 102 together. Prepreg may include, for example and without limitation, a reinforced or nonreinforced uncured glass fiber material. In other embodiments, the cavities 504 may contain prepreg 510 or component mounting base 502. The mating PCB 102 of FIG. 5 further illustrates a dielectric 506 positioned on the outside surfaces of the mating PCB 102. According to some embodiments contemplated herein, the dielectric 506 includes a copper cladding. It will be appreciated that while described as cladded in copper, the cladding of the dielectric 506 may be formed from any other suitable form of copper, and any other desired conductive material. FIG. 5 further depicts the internal trace 402 and rectangular conductor 404 visible at the bottom of the mating PCB 102. A solder ball 302 is illustrated as deposited on the internal layer trace 402 and rectangular conductor 404. Similarly, the embedded component 508 is shown in contact with the internal component edge 406 (shown in FIG. 4), with an associated deposition of a solder ball 302 on the component edge 406.

Figure 6:
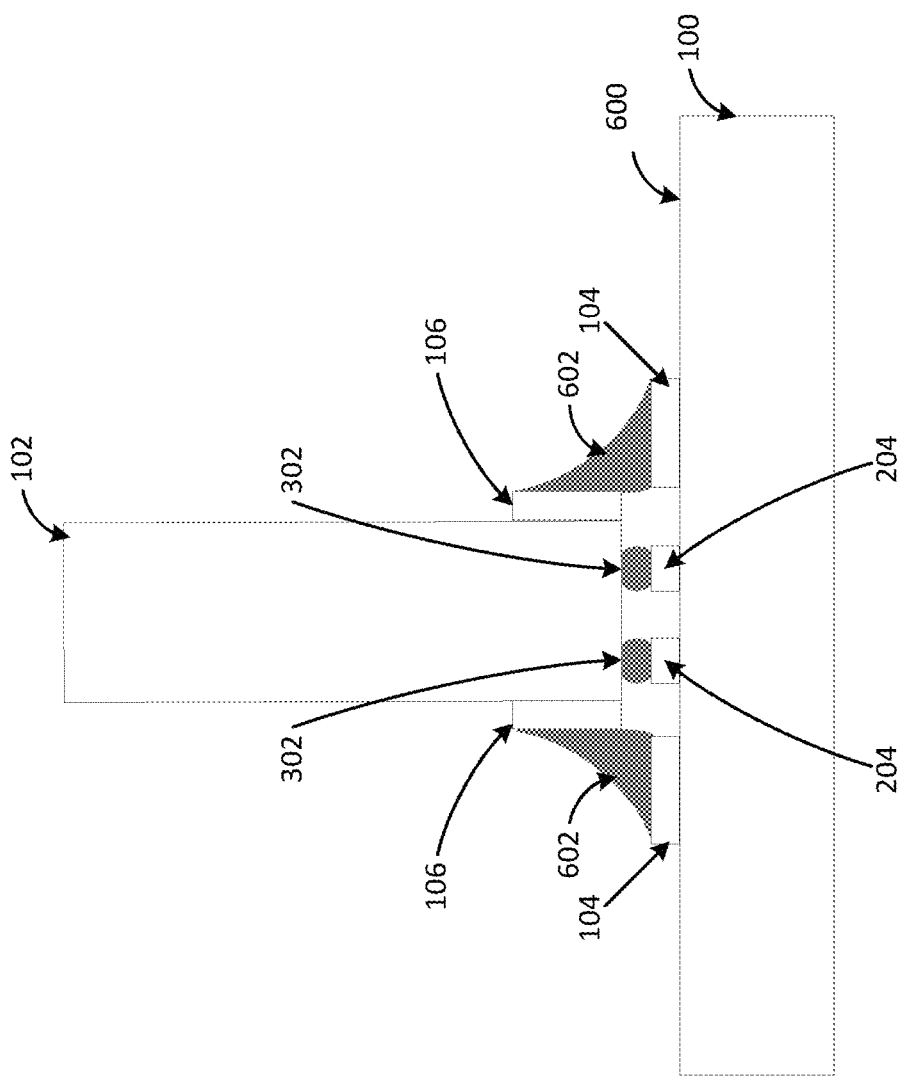
FIG. 6 is a representative illustration of a mating PCB coupled to a main PCB utilizing external solder connections in accordance with one aspect of the exemplary embodiment.

FIG. 6 illustrates a side view of the mating PCB 102 mounted to the main PCB 100 according to one embodiment of the subject application. As depicted in FIG. 6, the mating PCB 102 is suitably connected to a top surface 600 of the main PCB 100. The optional guide/mounting post/alignment pins 108 is not shown in FIG. 6. Further illustrated in FIG. 6 are the connections between the mating PCB 102 and the main PCB 100, both along the sides and the bottom of the mating PCB 102. Accordingly, the perimeter interior pads 204 of the main PCB 100 are shown coupled to the mating PCB 102 via the solder balls 302. In accordance with one embodiment, the solder balls 302 of the mating PCB 102 are suitably heated to enable soldering of the mating PCB 102 to the main PCB 100, thereby establishing a conductive connection between the internal trace/pads/component edges 402-406 (shown in FIG. 4) of the mating PCB 102 and the perimeter interior trace/pads 204 of the main PCB. Also shown are the external traces/pads 104 of the main PCB 100 joined to the external traces/pads 106 of the mating PCB 102 via solder 602.

Figure 7:
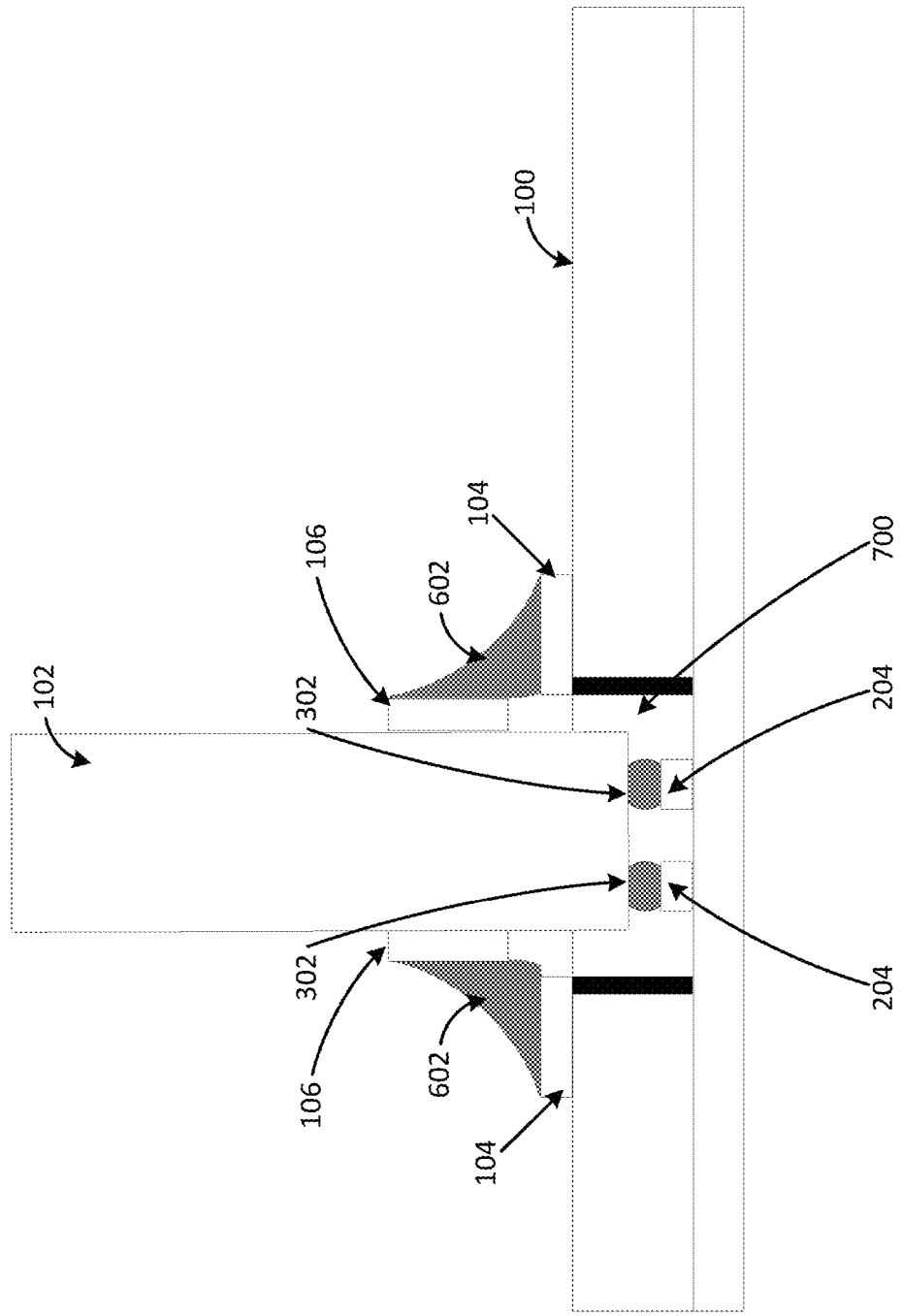
FIG. 7 is a representative illustration of a mating PCB coupled to a main PCB utilizing a pocket on the main PCB in accordance with one aspect of the exemplary embodiment.

FIG. 7 illustrates a side view of the mating PCB 102 mounted to the main PCB 100 via a pocket 700 located within the main PCB 100. It will be appreciated by those skilled in the art that the pocket 700 may be suitably sized to the dimensions of the mating PCB 102 allowing for the mating PCB 102 to fit therein. In other embodiments, the pocket 700 may be suitably sized to fit various mating PCB 102 dimensions. Although not shown in FIG. 7, the optional guide/mounting posts/alignment pins 108 may be affixed to the main PCB 100 to provide structural support, as discussed above with respect to FIGS. 1A-1B. As depicted in FIG. 7, the pocket 700 extends from a top surface of the main PCB 100 into the body of the board but does not extend through the bottom (opposite side) of the main PCB 100. Further, the pocket 700 includes a plurality of perimeter interior traces/pads 204 configured to contact opposing internal trace/pads/component edges 402-406 (illustrated in FIG. 4) of the mating PCB 102. As illustrated in FIGS. 3-4, the internal trace/pads/component edges 402-406 of the mating PCB 102 include solder balls 302 affixed thereto, which provide secure connectivity between the internal trace/pads 402-406 of the mating PCB 102 and the perimeter interior trace/pads 204 of the main PCB 100. The implementation of FIG. 7 utilizes solder connections 602 to couple the external trace/pads 104 of the main PCB 100 to the external trace/pads 106 of the mating PCB 102.

Figure 8:
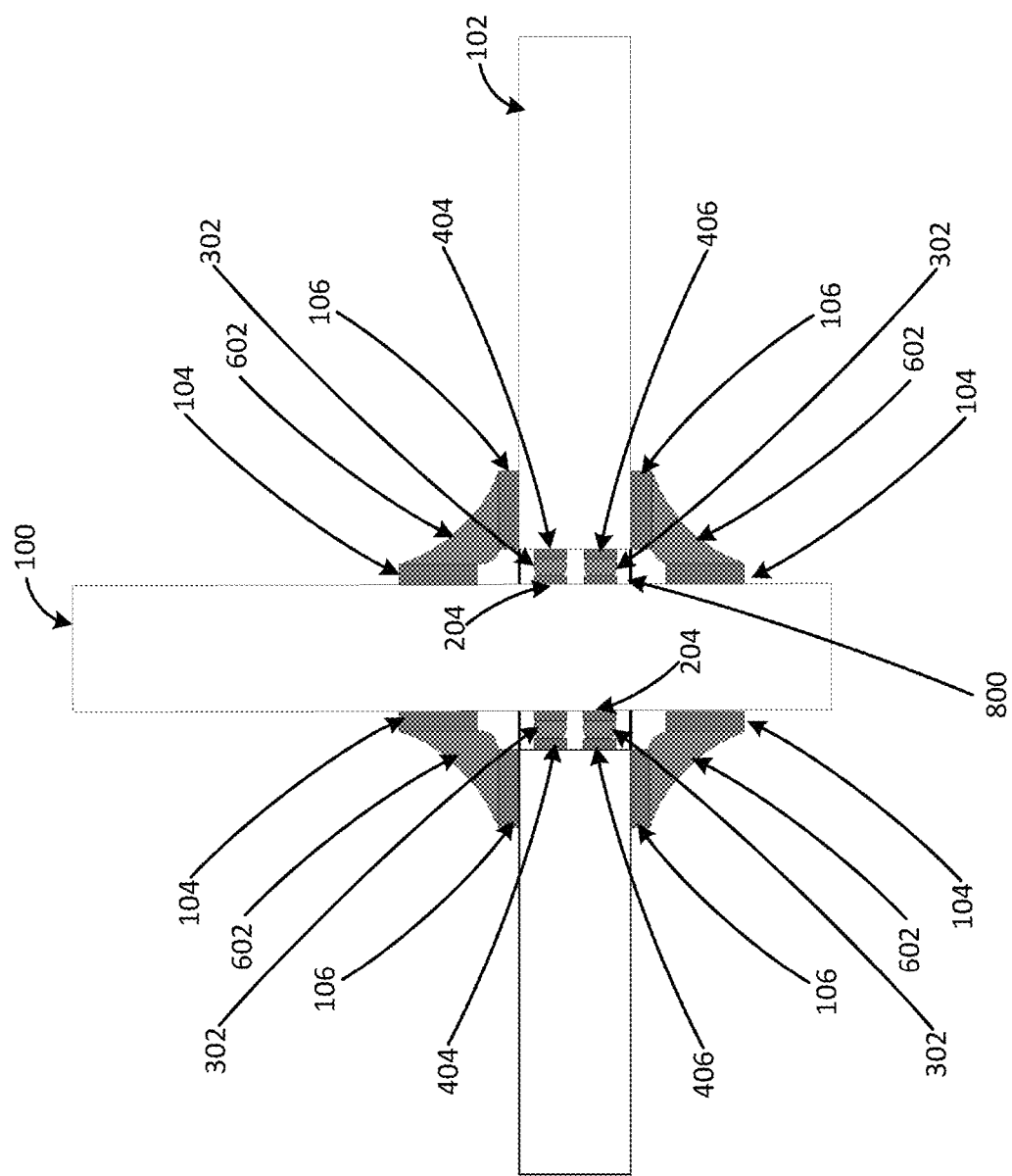
FIG. 8 is a representative illustration of a mating PCB coupled to a main PCB via a slot/cutout/recessed pocket of the main PCB in accordance with one aspect of the exemplary embodiment.

Referring now to FIG. 8, there is depicted another embodiment, wherein the main PCB 100 includes a slot/cutout/recessed pocket 800 through which the mating PCB 102 may be positioned. It will be appreciated that the embodiment shown in FIG. 8 provides additional connectivity between the mating PCB 102 and the main PCB 100, utilizing both sides of the mating PCB 102 and both insides of the slot/cutout/recessed pocket 800 of the main PCB 100. Accordingly, external traces/pads 104 are positioned on top and bottom portions of the main PCB 100, as well as on opposite sides of the slot/cutout/recessed pocket 800. These external traces/pads 104 are connected to corresponding external trace/pads 106 of the mating PCB 102 via solder connections 602.

The perimeter interior trace/pads 204 of the main PCB 100 are located within the pocket 800 and are shown on either side of the pocket 800. The internal trace/pads/component edges 402-406 are shown on either side of the mating PCB 102 in FIG. 8 and are positioned to connect to the perimeter interior trace/pads 204 of the main PCB 100 via the solder balls 302. Not shown in FIG. 8 is the optional guide/mounting post/alignment pins 108 to provide structural support/installation guidance to the mating PCB 102 as it is connected to the main PCB 100.

Figure 9:
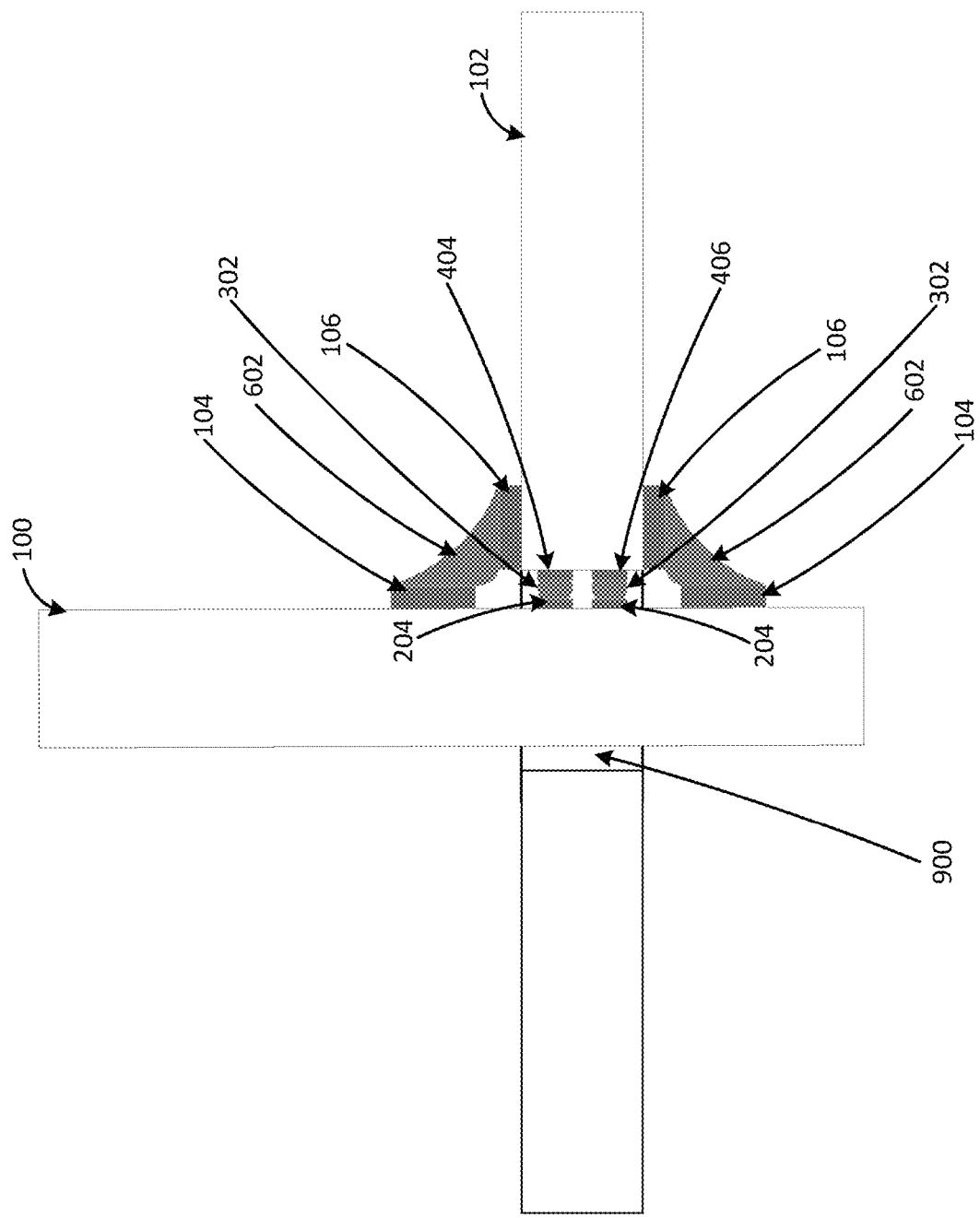
FIG. 9 is a representative illustration of a mating PCB coupled to a main PCB via a slot/cutout/recessed pocket of the main PCB in accordance with one aspect of the exemplary embodiment.

FIG. 9 provides an illustration of an alternate embodiment of FIG. 8, wherein the mating PCB 102 is inserted into a slot/cutout/recessed pocket 900 of the main PCB 100 with connections occurring only on a single side of the mating PCB 102 and corresponding side of the slot/cutout/recessed pocket 900 of the main PCB 100. The main PCB 100 includes perimeter interior trace/pads 204 located on one side of the slot/cutout/recessed pocket 900 and external trace/pads 104 located on the top and bottom of the main PCB 100 of the same side of the slot/cutout/recessed pocket 900. In some embodiments of FIG. 9, the side opposing the mating PCB 102 within the slot/cutout/recessed pocket 900 may be left as a cavity or filled with material types for Electrical and Electronics Potting and Encapsulating or material used for Electronics Glob-Top techniques such as, but not limited to Loctite ECCOBOND Encapsulant, Loctite STYCAST Potting material, or Loctite 380 (Black Max) instant adhesive. As shown in FIG. 9, the external trace/pads 104 of the main PCB 100 are connected to the external trace/pads 106 of the mating PCB 102 via solder connections 602. Further, the perimeter interior trace/pads 204 are coupled to corresponding internal trace/pads/component edges 402-406 via solder balls 302 within the pocket 900 of the main PCB 100. The optional guide/mounting post/alignment pins 108 is not depicted in FIG. 9. It will be appreciated that either side may be used in the embodiment of FIG. 9, and further, that a single external pad/trace 104 may be used (e.g., only on the top or only on the bottom of the main PCB 100) in accordance with other embodiments contemplated herein.

Figure 10:
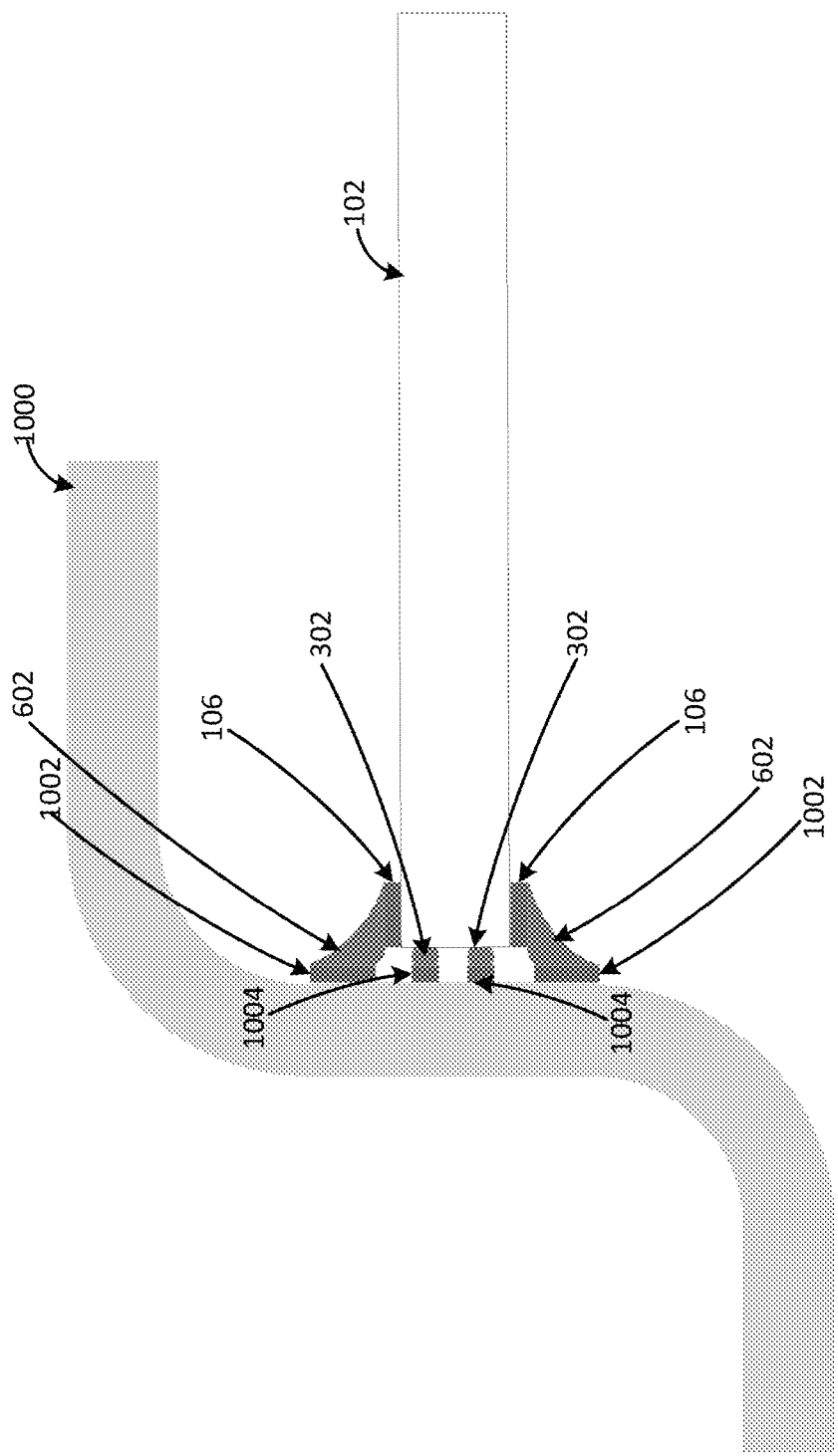
FIG. 10 is a representative illustration of a rigid mating PCB coupled to a flexible PCB in accordance with one aspect of the exemplary embodiment.

FIG. 10 illustrates one embodiment wherein the main PCB 100 is replaced by a flexible main PCB 1000. It will be appreciated that the flexible main PCB 1000 may be configured and constructed similar to the main PCB 100 illustrated in FIGS. 1-9 above, e.g., including the same components and connections described therein. The flexible main PCB 1000 may be a polyimide flex printed circuit board, although other compositions of such a flexible board may be used in accordance with the embodiments disclosed herein. As shown in FIG. 10, the flexible main PCB 1000 includes external trace/pads 1002 and perimeter interior trace/pads 1004 position on an outer surface of the flexible PCB 1000. The skilled artisan will appreciate that the illustration of all traces/pads 1002-1004 on an external surface of the flexible main PCB 1000, however embodiments contemplated herein may utilize a pocket (not shown) with the perimeter interior traces/pads 1004 positioned within the pocket similar to FIGS. 8 and 9. The mating PCB 102 includes external trace/pads 106 and internal trace/pads/component edges 402-406, as described above. In the embodiment depicted in FIG. 10, the external trace/pads 1002 of the flexible main PCB 1000 are coupled to the external trace/pads 106 of the mating PCB 102 via solder connections 602. As shown, the perimeter interior trace/pads 1004 of the flexible main PCB 100 are coupled to the internal trace/pads/component edges 402-406 via solder balls 302, as discussed above. Another embodiment of FIG. 10 is a main rigid-flexible PCB wherein the PCB is a combined board fabrication consisting of a rigid PCB 100 and a flexible PCB 1000. The connector of the mating PCB 102 may be connected to the rigid portion of the combined rigid-flexible board or the flexible portion of the rigid-flexible board or both the rigid and the flexible portions of the rigid-flexible board.

Figure 11:
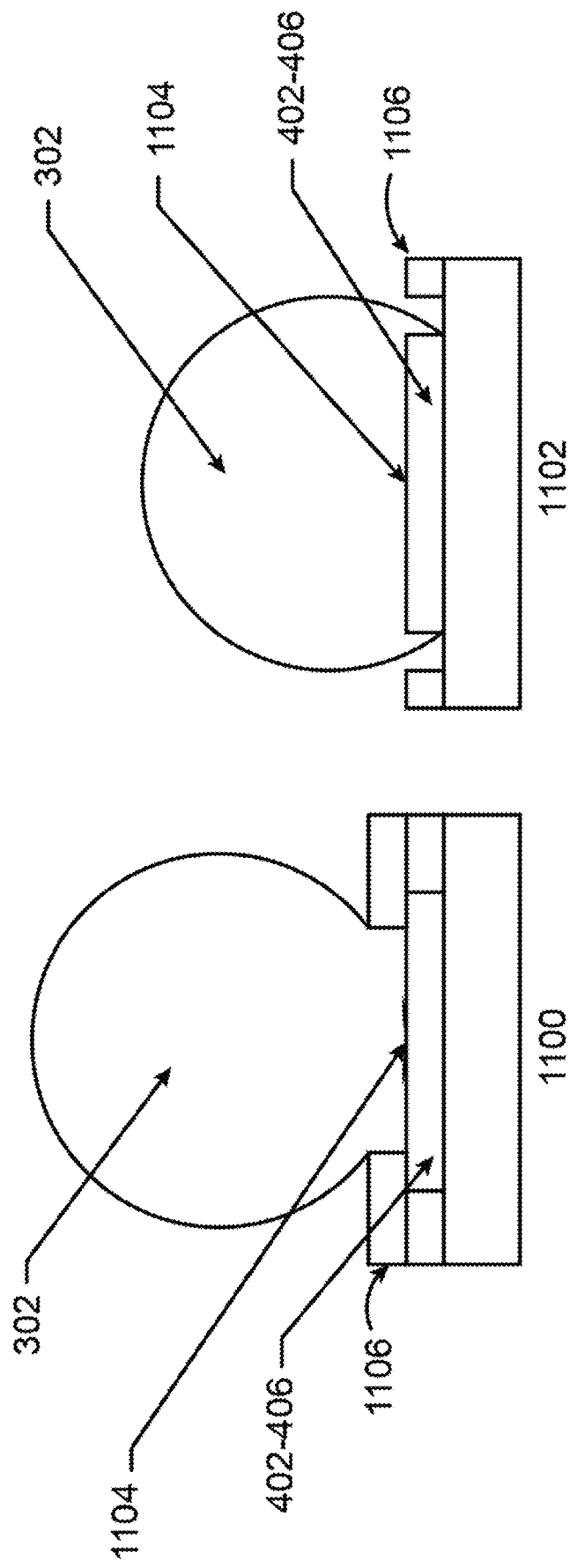
FIG. 11 is an illustration representative of solder ball configurations on the mating PCB in accordance with one aspect of the exemplary embodiment.
Figure 12:
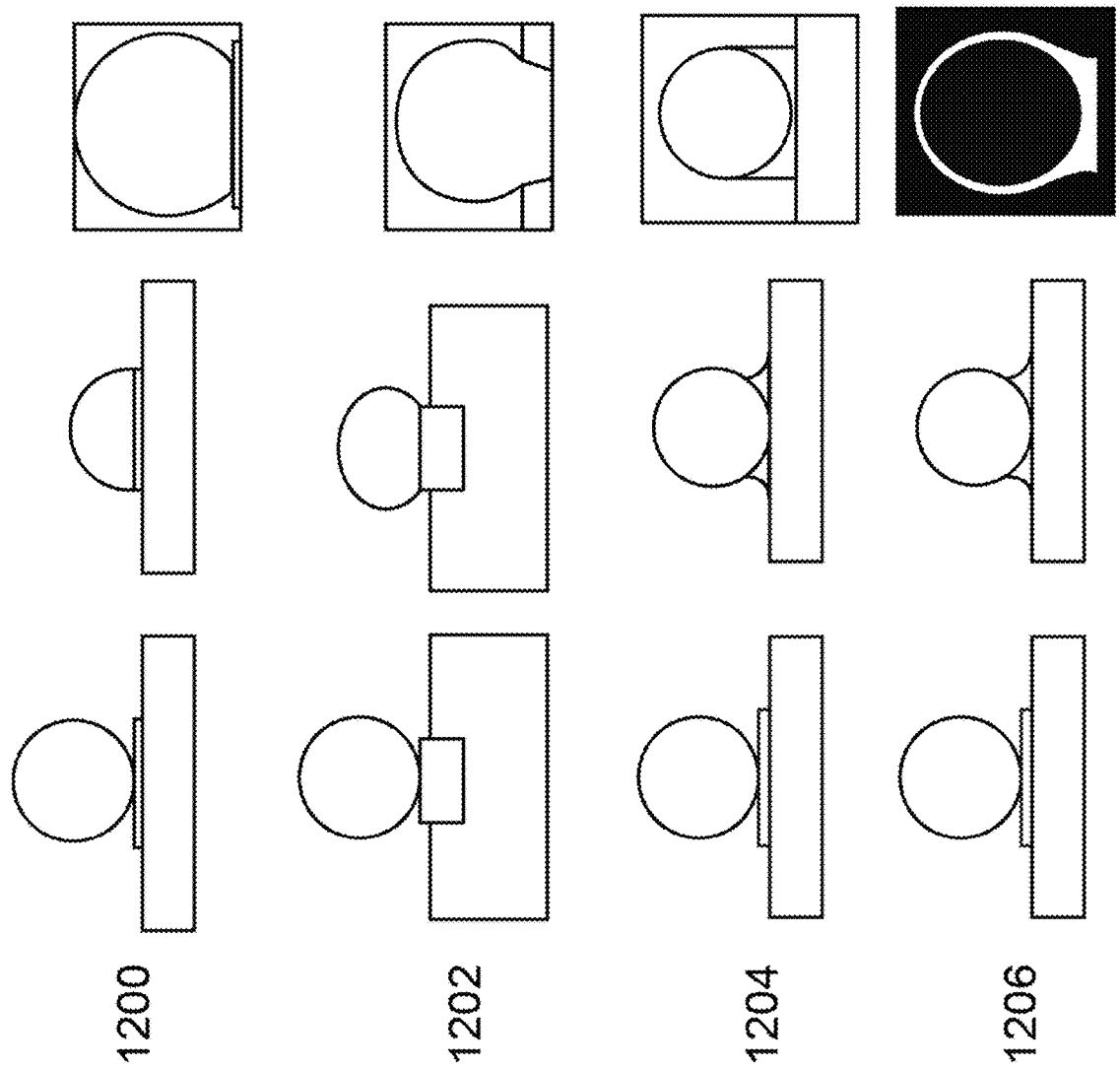
FIG. 12 is an illustration representative of various solder attachment solder balls used for mating the mating PCB to the main PCB in accordance with one aspect of the exemplary embodiment.

Referring now to FIGS. 11-12, there are shown various clarifying illustrations of the solder ball 302 utilized in the varying embodiments discussed above. FIG. 11 provides an illustration of a solder mask defined (SMD) solder ball 1100 and a non-solder mask defined (NSMD) solder ball 1102 that may be used in accordance with the embodiments disclosed herein. As shown in FIG. 11, the SMD 1100 employs a solder ball 302 joined at a solder junction 1104 to the internal trace/pad/component edge 402-406, resulting in a portion of the internal trace/pad/component edge 402-406 covered by the mask 1106, e.g. solder resistant material, and thus not in contact with the solder ball 302. In contrast, the NSMD 1102 employs a solder ball 302 joined at a solder junction 1104 completely covering the internal trace/pad/component edge 402-406. Use of an SMD 1100 or NSMD 1102 implementation is determined in accordance with the structure of the main PCB 100 and the mating PCB 102.

It will be understood that the SMD 1100 utilizes apertures in the solder mask 1106 specified such that the opening in the mask 1106 is smaller than the diameter of the internal trace/pad/component edge 402-406 that they cover. This effectively shrinks the size of the internal trace/pad/component edge 402-406 that will be soldered. As will be appreciated, SMD 1100 embodiments create two distinct advantages. First, the overlapping mask 1106 may assist in preventing the internal trace/pads/component edges 402-406 from lifting off of the mating PCB 102 due to thermal or mechanical stress. Second, the opening in the mask 1106 creates a channel for each solder ball 302 on an associated ball grid array (BGA) to align with while progressing through the soldering process.

In contrast, the NSMD 1102 implementation differ from SMD 1100 as the solder mask 1106 is defined (e.g. deposited) to not make contact with the internal trace/pads/component edges 402-406. Instead, the mask 1106 is created such that a gap is created between the edge of the internal trace/pads/component edges 402-406 and the solder mask 1106. In this method, the size of the internal trace/pads/component edges 402-406 is not defined by the layer of mask 1106, but only by the diameter of the internal trace/pads/component edges 402-406 themselves. Accordingly, NSMD 1102 implementations can be smaller than the diameter of the solder ball 302. Typically, this reduction in pad size is 20% smaller than the ball diameter. Since the size of the internal trace/pads/component edges 402-406 can be reduced with this approach, more room is created between adjacent internal trace/pads/component edges 402-406 allowing for easier trace routing. Because the entire internal trace/pads/component edges 402-406 is exposed, NSMD 1102 tend to have better solder adhesion than SMD 1100. The solder ball 302 can make a connection to the entire internal trace/pads/component edges 402-406 of the NSMD 1102 rather than the mask defined portion of SMD 1100 implementation.

FIG. 12 depicts various types of solder balls 302 capable of being used in the subject embodiments. It will be appreciated that the four types of balls 302 illustrated in FIG. 12 are intended to provide nonlimiting examples of solder capable of being utilized in joining the mating PCB 102 to the main PCB 100, and the skilled artisan will appreciate that other types of solder may be used in accordance with the size, type/structure of PCBs 100-102, temperature constraints, materials, and the like. FIG. 12 depicts a eutectic ball 1200 comprising 63% Sn and 37% Pb, indicating a low temperature ball attachment (peak temperature of 225+/−5° C.) resting on flux on an organic or HITCE substrate. The first image depicts the combination before reflow, the second image after reflow, and the third image a representative image of the post reflow implementation. FIG. 12 further illustrates a DBGA ball 1202 (eutectic-like solder) comprising 46% Sn, 46% Pb, and 8% Bi, indicating a low temperature ball attachment (peak temperature of 220+/−10° C.) resting on solder paste on a ceramic substrate. The first image depicts the combination before reflow, the second image after reflow, and the third image a representative image of the post reflow implementation. Also shown is a CBGA ball 1204 with eutectic solder (90% Pb, 10% Sn), indicating a high temperature ball attached via low temperature paste (peak temperature of 225+/−5° C.) on a ceramic or HITCE substrate. The first image depicts the combination before reflow, the second image after reflow, and the third image a representative image of the post reflow implementation. Lastly, FIG. 12 illustrates a lead free polymer core ball 1206 (SnAgCu solder such as SAC306) utilizing a higher temperature ball attachment (peak temperature of 235+/−5° C.) resting on SnAgCu paste an organic or ceramic substrate. The first image depicts the combination before reflow, the second image after reflow, and the third image a representative image of the post reflow implementation. As illustrated in FIG. 12, each of the balls 1202-1206 utilizes a flux or paste for affixing the ball 1202-1206 to the underlying trace/pad 402-406 (not shown in FIG. 12).

As illustrated above, the various embodiments disclosed herein allow for the direct board-to-board orthogonal mating thereby eliminating the need for connectors. Further, the board to header connector orthogonal mating does not require the use of a mating connector on the second board. In the disclosed embodiments, PCB connector enables higher density connections on multiple layers (internal and external) of the PCBs being connected. As will be appreciated by those skilled in the art, the disclosed embodiments enable a smaller overall footprint/size in applications utilizing main PCBs and mating PCBs.

It will further be appreciated that the embodiments disclosed above enable the use of more PCB space by taking stacked board mating methodologies and replacing such methodologies with an orthogonal interface. The skilled artisan will also appreciate that the embodiments disclosed herein enable more efficient radiofrequency (RF) communications by relocating the antenna away from the ground planes, e.g., positioned on the end of the mating PCB 102 opposite the end attached to the main PCB 100. Furthermore, the orthogonal attachments described above provide greater cooling to the PCBs 100, 102 by increasing the distance between components, increasing airflow around components, enabling use of larger heatsinks on boards, and the like. The skilled artisan will understand that the PCB connector improves electromagnetic compatibility (EMC) performance.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

To aid the Patent Office and any readers of this application and any resulting patent in interpreting the claims appended hereto, applicants do not intend any of the appended claims or claim elements to invoke 35 U.S.C. 112(f) unless the words "means for" or "step for" are explicitly used in the particular claim.

The invention claimed is:

1. A printed circuit board edge terminal connector of a main printed circuit board, comprising:
    at least one trace coupled to at least one external pad, the at least one external pad positioned around a perimeter configured to receive an associated mating printed circuit board; and
    at least one trace coupled to at least one perimeter interior pad, the at least one perimeter interior pad positioned within the perimeter,
    wherein the at least one trace coupled to the at least one external pad and the at least one trace coupled to the at least one interior pad are separate from each other.

2. The printed circuit board edge terminal connector of claim 1, wherein the main printed circuit board further comprises a slot located on a top surface of the main printed circuit board configured to receive the associated mating printed circuit board therein.

3. The printed circuit board edge terminal connector of claim 2, wherein the slot extends partially into the main printed circuit board.

4. The printed circuit board edge terminal connector of claim 3, wherein the at least one perimeter interior pad is positioned inside the slot along a first surface thereof; or wherein a plurality of perimeter interior pads are positioned along a first surface and a second surface of the slot.

5. The printed circuit board edge terminal connector of claim 2, wherein the slot extends through the main printed circuit board.

6. The printed circuit board edge terminal connector of claim 5, wherein the at least one perimeter interior pad is positioned inside the slot along a first surface thereof, or wherein a plurality of perimeter interior pads are positioned along a first surface and a second surface of the slot.

7. The printed circuit board edge terminal connector of claim 1, further comprising:
    at least one guidepost positioned on an edge of the perimeter and extending outward from the surface of the main printed circuit board, wherein the at least one guidepost is configured to provide mechanical support to the associated mating printed circuit board; or
    at least one guidepost positioned within the perimeter and extending outward from the surface of the main printed circuit board, wherein the associated mating printed circuit board includes at least one cavity configured to receive the at least one guidepost, the at least one guidepost providing internal mechanical support to the mating printed circuit board.

8. A printed circuit board edge terminal connector of a mating printed circuit board, comprising:
    at least one external pad coupled to at least one trace, the at least one external pad positioned on a first outer surface of the mating printed circuit board and configured to contact a corresponding at least one external pad of an associated main printed circuit board; and
    at least one internal pad coupled to at least one trace, the at least one internal pad positioned on a second outer surface of the mating printed circuit board.

9. The printed circuit board edge terminal connector of claim 8, further comprising at least one solder ball coupled to the at least one internal pad.

10. The printed circuit board edge terminal connector of claim 8, further comprising at least one second internal pad and at least one second external pad positioned on a surface of the mating printed circuit board opposite the first outer surface and the second outer surface.

11. The printed circuit board edge terminal connector of claim 8, further comprising at least one guidepost positioned on an edge of the mating printed circuit board and configured to connect the mating printed circuit board to an associated main printed circuit board.

12. The printed circuit board edge terminal connector of claim 8, wherein the mating printed circuit board includes at least one cavity configured to receive at least one guidepost, the at least one guidepost providing internal mechanical support to the mating printed circuit board.

13. The printed circuit board edge terminal connector of claim 8, wherein the mating printed circuit board comprises:
- a core comprising a plurality of layers, at least one layer including at least one internal conductive trace;
- wherein the edge terminal connector further comprises:
- at least one external trace coupled to a corresponding at least one external pad, the at least one external trace pad positioned on a first outer surface of the printed circuit board and configured to contact a corresponding at least one external trace pad of an associated main printed circuit board; and
- at least one internal trace pad coupled to the at least one internal trace, the at least one internal trace pad positioned on a second outer surface of the printed circuit board.

14. A printed circuit board, comprising:
- a core comprising a plurality of layers, at least one layer including an internal conductive trace; and
- a printed circuit board edge terminal connector, comprising:
- at least one external trace coupled to a corresponding at least one external pad, the at least one external pad positioned around a perimeter configured to receive an associated mating printed circuit board; and
- at least one internal trace pad coupled to the internal conductive trace, the at least one internal pad positioned within the perimeter.

15. The printed circuit board of claim 14, further comprising a slot located on a top surface, the slot configured to receive the associated mating printed circuit board therein.

16. The printed circuit of claim 15, wherein the slot extends partially into the printed circuit board, and wherein the at least one internal trace pad is positioned inside the slot along at least one surface thereof.

17. The printed circuit board of claim 15, wherein the slot extends partially into the printed circuit board, and wherein a plurality of internal trace pads are positioned along a first surface and a second surface of the slot.

18. The printed circuit board of claim 15, wherein the slot extends through the printed circuit board, and wherein the at least one internal pad is positioned inside the slot along a first surface thereof.

19. The printed circuit board of claim 15, wherein the slot extends through the printed circuit board, and wherein a plurality of internal trace pads are positioned along a first surface and a second surface of the slot.

20. The printed circuit board of claim 15, further comprising:
- at least one guidepost positioned on an edge of the perimeter and extending outward from the surface of the main printed circuit board, wherein the at least one guidepost is configured to provide mechanical support to the associated mating printed circuit board; or
- at least one guidepost positioned within the perimeter and extending outward from the surface of the main printed circuit board, wherein the associated mating printed circuit board includes at least one cavity configured to receive the at least one guidepost, the at least one guidepost providing internal mechanical support to the mating printed circuit board.

* * * * *